United States Patent
Zhu

(10) Patent No.: US 10,170,563 B2
(45) Date of Patent: Jan. 1, 2019

(54) GALLIUM NITRIDE SEMICONDUCTOR DEVICE WITH IMPROVED TERMINATION SCHEME

(71) Applicant: Alpha and Omega Semiconductor Incorporated, Sunnyvale, CA (US)

(72) Inventor: Tinggang Zhu, Cupertino, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 343 days.

(21) Appl. No.: 13/763,649

(22) Filed: Feb. 9, 2013

(65) Prior Publication Data

US 2014/0225120 A1 Aug. 14, 2014
US 2018/0182853 A9 Jun. 28, 2018

Related U.S. Application Data

(62) Division of application No. 12/589,911, filed on Oct. 30, 2009, now Pat. No. 8,372,738.

(51) Int. Cl.
| | |
|---|---|
| *H01L 29/20* | (2006.01) |
| *H01L 29/872* | (2006.01) |
| *H01L 29/66* | (2006.01) |
| *H01L 29/06* | (2006.01) |

(52) U.S. Cl.
CPC ...... *H01L 29/2003* (2013.01); *H01L 29/0619* (2013.01); *H01L 29/66212* (2013.01); *H01L 29/872* (2013.01)

(58) Field of Classification Search
CPC ................................................ H01L 29/2003
See application file for complete search history.

(56) References Cited

U.S. PATENT DOCUMENTS

| | | | |
|---|---|---|---|
| 7,229,866 B2* | 6/2007 | Zhu | H01L 29/0615 438/167 |
| 7,615,839 B2 | 11/2009 | Souma et al. | |
| 2004/0061195 A1 | 4/2004 | Okada et al. | |
| 2005/0139947 A1* | 6/2005 | Okada | H01L 29/66143 257/480 |
| 2005/0194610 A1* | 9/2005 | Souma | H01L 29/66143 257/133 |
| 2005/0230777 A1* | 10/2005 | Chiola | H01L 27/08 257/480 |
| 2006/0043480 A1* | 3/2006 | Tsuchitani | H01L 29/0634 257/341 |
| 2009/0101974 A1* | 4/2009 | Saito | H01L 29/0615 257/342 |
| 2009/0121305 A1* | 5/2009 | Pan | H01L 31/18 257/436 |
| 2011/0101369 A1* | 5/2011 | Zhu | H01L 29/0619 257/76 |
| 2012/0056262 A1* | 3/2012 | Saito | H01L 29/7839 257/330 |

FOREIGN PATENT DOCUMENTS

CN 101221980 A 7/2008

\* cited by examiner

*Primary Examiner* — Eugene Lee
(74) *Attorney, Agent, or Firm* — Bo-Lin Lin

(57) ABSTRACT

This invention discloses a gallium nitride based semiconductor power device disposed in a semiconductor substrate. The power device comprises a termination area disposed at a peripheral area of the semiconductor power device comprises a termination structure having at least a guard ring disposed in a trench filled with doped gallium-based epitaxial layer therein.

9 Claims, 6 Drawing Sheets

GALLIUM NITRIDE SEMICONDUCTOR DEVICE WITH IMPROVED TERMINATION SCHEME

This patent application is a Divisional Application and claim the Priority Date of Application of a co-pending Application with a Ser. No. 12/589,911 filed by a common Inventor of this Application on Oct. 30, 2009. The disclosures made in application Ser. No. 12/589,911 are hereby incorporated by reference.

BACKGROUND OF THE INVENTION

1. Field of the Invention

The invention relates generally to the configurations and methods of manufacturing the semiconductor devices. More particularly, this invention relates to a gallium nitride (GaN)-based device implemented with new device configurations and manufacturing methods for providing reliable and high quality termination structure with guard rings formed by applying an epitaxial growth method.

2. Description of the Prior Art

The gallium nitride (GaN) based devices such as Schottky diodes have the advantage over silicon devices in achieving a high blocking voltage, while maintaining a low on-resistance using a small semiconductor die. However, conventional methods of configuring and manufacturing gallium nitride (GaN) based devices including Schottky diodes as a rectifying device or devices for other functional applications are still challenged by a technical limitation of lacking controllable manufacturing processes to assure a reliable termination structure can be provided. At the edges and corners of a semiconductor die, there is a high electric field, so a termination structure is needed to ensure that breakdown occurs in the main portion of the device rather than at the edges, i.e., termination region. Due to the wide band-gap nature of the nitride semiconductor, reliable guard rings such as P-type guard rings cannot be conveniently provided by applying the conventional implant and diffusion processes commonly used with silicon based semiconductors.

In U.S. Pat. No. 7,229,866, entitled "Non-activated guard ring for semiconductor devices", a semiconductor device with a guard ring is disclosed. FIG. 1 shows laterally conducting Schottky diode 100. The Schottky diode includes an electrically insulating substrate 102 and a buffer structure 104. A highly doped semiconductor layer 106 is disposed atop the buffer structure 104. A semiconductor contact layer 108, a lower doped semiconductor layer is disposed atop a portion of the more highly doped semiconductor layer 106. A Schottky metal contact 110 is located atop the semiconductor contact layer 108 and forms a metal-to-semiconductor rectifying junction with the semiconductor layer 108. A thicker bond pad metal layer 112 is disposed atop the Schottky metal contact 110. A guard ring 120 is formed within the semiconductor layer 108 and is located at or near the edge of the mesa. The guard ring 120 serves to reduce the high electric fields located at the edges of the Schottky metal contact as well as reduce the leakage current that occurs when the device is reverse biased. An ohmic metal contact 116 is disposed atop a portion of the higher doped layer 106, and a thicker bond pad metal layer 118 is disposed atop the ohmic metal contact 116. A passivation layer 114 may be formed at least between the stacked structure formed by the ohmic metal contact 116 and bond pad layer 118 and the stacked structure formed by the semiconductor layer 108, Schottky metal contact 110 and bond pad metal layer 112. The guard rings as shown are formed by ion implantation into the semiconductor contact layer without completely annealing the semiconductor contact layer to form a high resistance region. The guard ring may be located at the edge of the layer or, alternatively, at a distance away from the edge of the layer. A Schottky metal contact is formed atop the layer, and the edges of the Schottky contact are disposed atop the guard ring.

However, for the nitride semiconductor device, an edge termination structure implemented with guard rings 120 as shown in FIG. 1, when formed by ion implantations followed by thermal activation or even without thermal activation or diffusions, does not form a true P-type semiconductor region, but often become highly resistive or semi-insulative instead of the intended P-type semiconductor materials to carry out the guard ring functions. Furthermore, the highly resistive edge termination structures formed by the implant process are embedded with defects from the gallium nitride semiconductor, which causes poor reliability or poor unclamped inductive switching (UIS) capability.

There is an urgent demand to overcome such limitation especially for gallium nitride based Schottky diodes. As a rectifier, the Schottky diode is ideal for application to minimize the switching loss where the energy consumption occurs during the switch mode such as an application to a switch-mode power supply (SMPS) device. A SMPS device when implemented with GaN based Schottky diode can deliver greater efficiency of power utilization with reduced switching loss and with high blocking voltage. However, a reliable termination structure such as P-type guard rings formed close to the device edge near an anode electrode is necessary to assure high performance reliable operations. However, as discussed above, for those of ordinary skill in the art, reliable and high quality P-type guard rings are hard to realize for the GaN based devices. Conventional ion implantation and diffusion processes are not useful to form the guard rings with good quality and reliable performance.

For these reasons, there are demands to provide device configurations and manufacturing methods to provide high quality and reliable guard rings in the termination areas for the GaN based devices such that the above-discussed difficulties and limitations may be resolved.

SUMMARY THE PRESENT INVENTION

It is therefore an aspect of the present invention to provide a new and improved termination structure by forming the P-type guard rings near the edges of the device by applying an epitaxial growth process in the trenches to form the guard rings. The guard rings are formed with controllable dopant profiles with uniform density and improved structural integrity, reduced resistance, and reliable performance characteristics. The limitations and difficulties as that encountered in the conventional methods of manufacturing the termination structures are therefore resolved.

It is another aspect of the present invention to provide unproved device configuration and method for manufacturing as GaN-based semiconductor device supported by improved and reliable P-type guard rings to function as a termination structure. The reliable guard rings can therefore reduce the high electric fields located at the edges of the Schottky metal contact as well as reduce the leakage current that occurs when the device is reverse biased.

It is another aspect of the present invention to provide improved device configuration and method for manufacturing a GaN-based semiconductor device with improved and reliable guard rings and further with junction barrier Schottky structure termed by growing p-type epitaxial GaN semiconductor in the trenches underneath the Schottky anode electrode. The breakdown performance of the device is further improved.

Briefly in a preferred embodiment this invention discloses a gallium nitride based semiconductor power device. The GaN based semiconductor power device includes a termination area disposed at a peripheral area of the semiconductor power device comprises a termination structure having at least a guard ring disposed in a trench filled with P-doped gallium-based epitaxial layer therein. In another embodiment, the gallium nitride based semiconductor power device further includes a Schottky diode disposed in a main area of the semiconductor device. In another embodiment, the gallium nitride based semiconductor power device further includes an N-type GaN layer disposed on top of an N++ GaN layer with an anode in electrical connection with the N type GaN layer and a cathode in electrical connection with the N++ GaN layer to function as a gallium based diode wherein the termination structure comprises the trenches filled with a P-type GaN layer disposed on peripheral area of the N-type GaN layer. In another embodiment, the gallium nitride based semiconductor power device further includes an N-type GaN layer disposed on top of an N++ GaN layer with a Schottky metal layer disposed on top of the N type GaN layer and a cathode in electrical connection with the N++ GaN layer to function as a gallium based Schottky diode wherein the termination structure disposed on peripheral area of the N type GaN layer. In another embodiment, the gallium nitride based semiconductor power device further includes an N-type GaN layer disposed on top of an N++ GaN layer with a Schottky metal layer disposed on top of the N type GaN layer and a cathode in electrical connection with the N++ GaN layer. And, the semiconductor power device further includes a plurality of trenches underneath the Schottky metal layer opened in the GaN type layer lilted with P-type gallium based epitaxial layer therein to function as a gallium based junction barrier Schottky (JBS) diode wherein the termination structure disposed on peripheral area of the N type GaN layer. In another embodiment, the termination structure further comprises a field plate disposed on top of the guard ring. In another embodiment, the gallium nitride based semiconductor power device further includes a first gallium based semiconductor layer having a first dopant concentration disposed on top of a second gallium based semiconductor layer of a different dopant concentration with an anode in electrical connection with the first gallium based layer and a cathode in electrical connection with the second gallium based semiconductor layer to function as a gallium based diode wherein the termination structure comprises the trenches filled with a P-type gallium based semiconductor layer disposed on peripheral area of the first gallium based semiconductor layer. In another embodiment, the gallium nitride based semiconductor power device further includes a first gallium based semiconductor layer having a first dopant concentration disposed on top of a second gallium based semiconductor layer of a different dopant concentration with a Schottky metal layer disposed on top of the first gallium based semiconductor layer and a cathode in electrical connection with the second gallium based semiconductor layer to function as a gallium based Schottky diode wherein the termination structure comprises the trenches filled with a P-type gallium based semiconductor layer disposed on peripheral area of the first gallium based semiconductor layer. In another embodiment, the gallium nitride based semiconductor power device further includes a first gallium based semiconductor layer having as first dopant concentration disposed on top of a second gallium based semiconductor layer of a different dopant concentration with a Schottky metal layer disposed on top of the first gallium based semiconductor layer and a cathode in electrical connection with the second gallium based semiconductor layer. And, the GaN based semiconductor power device further includes a plurality of trenches underneath the Schottky layer opened in the first gallium based semiconductor layer filled with P-type gallium based epitaxial layer therein to function as a gallium based junction barrier Schottky (JBS) diode wherein the termination structure disposed on peripheral area of the first gallium based semiconductor layer.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1:
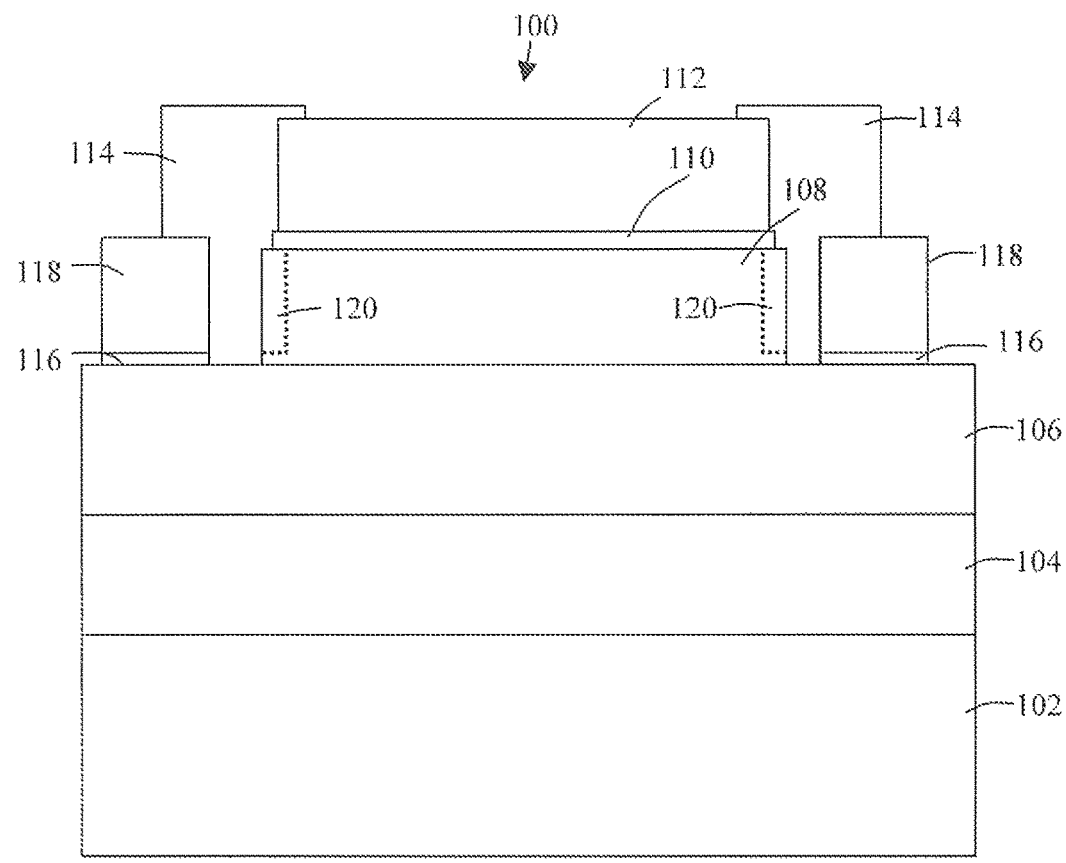
FIG. 1 is cross sectional view to show a conventional GaN-based diode.
Figure 2:
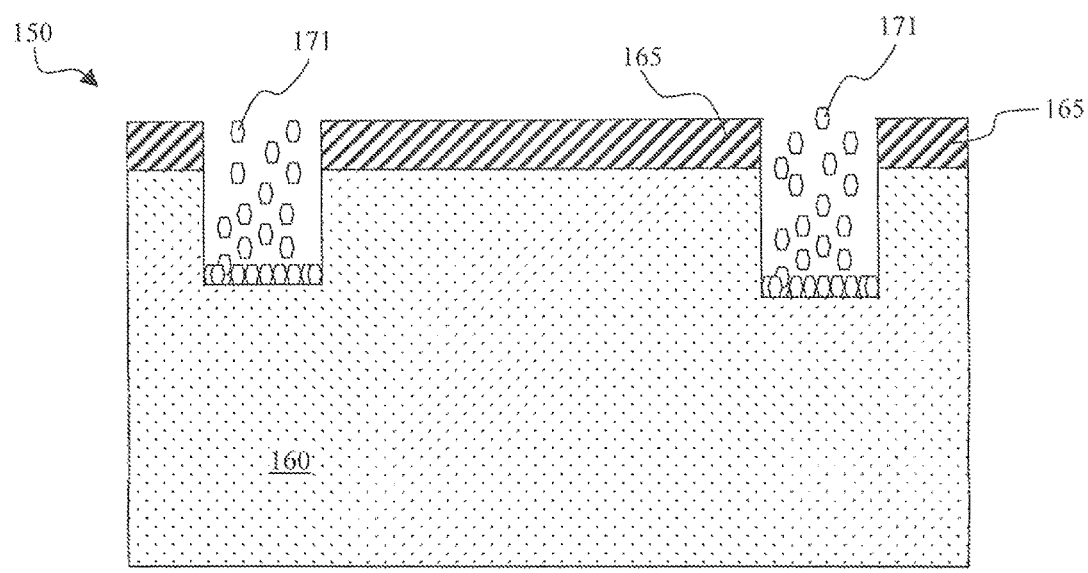
FIG. 2 is a cross sectional view of GaN-based semiconductor device formed with guard rings of this invention.
Figure 2A:
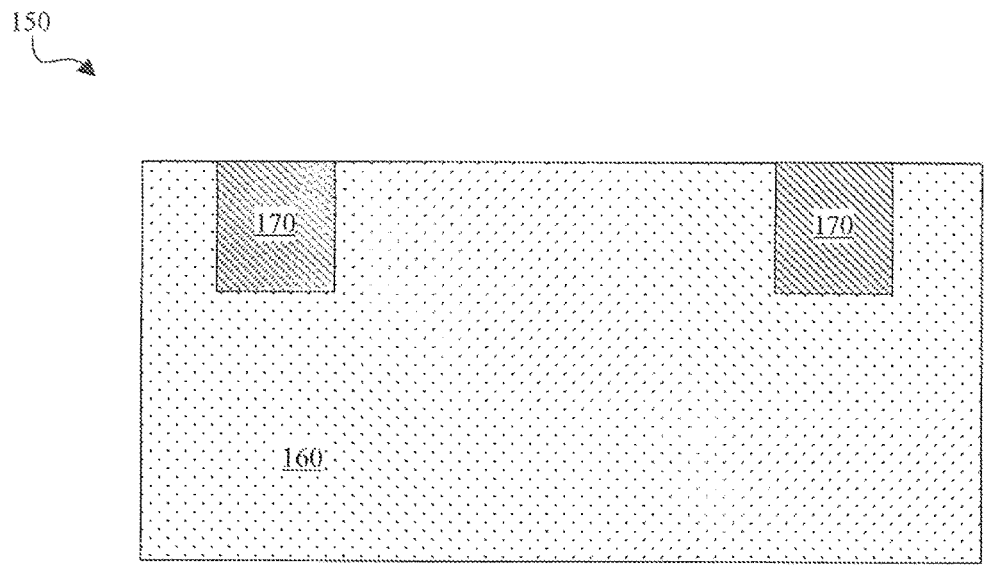
FIG. 2A is a cross sectional view of the device of FIG. 2 formed with guard rings.

Refer to FIGS. 2 and 2A for a cross sectional view of a semiconductor device 150. The detailed configurations of the device 150 are not specifically shown here. The semiconductor device 150 includes an N-type Gallium nitride layer 160. The semiconductor device 150 further includes termination structures with p-type guard rings 170 formed by selective epitaxial growth 171. The epitaxial growth 171 is shown in FIG. 2, while the completed p-type guard rings are shown in FIG. 2A. By epitaxially growing the P-type GaN, the P-type guard rings 170 are formed having high quality and true P-type. As will be further described below the p-type guard rings are formed by applying a re-growth mask 165 to open trenches in the GaN layer 160. Then guard rings 170 are formed by epitaxial growth 171 in these trenches followed by removal of the regrowth mask 165 and a chemical mechanical planarization (CMP) process to planarize the p-type guard rings 170 complete the processes of forming the termination structure with P-type guard rings. By applying an epitaxial growth process, the doping profile of the P-type dopant in the guard rings 170 is controllable.

The guard rings 170 are formed with greatly reduced defects with lower resistance thus ensuring the device 150 is operated with significantly improved ruggedness. The device with the improved guard rings further has improved unclamped inductive switching (UIS) capability and reliable performance over prolonged life operation cycles.

Figure 3:
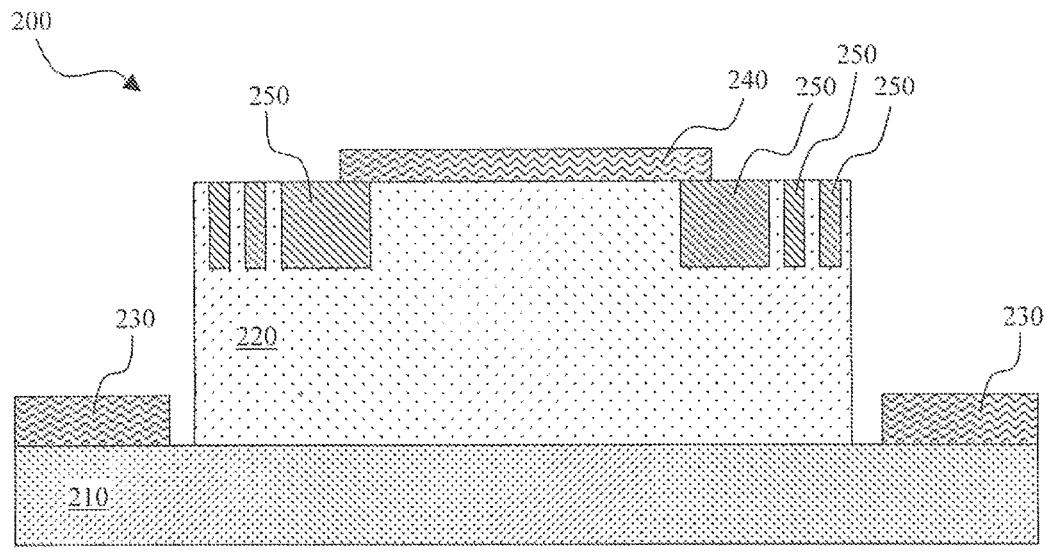
FIG. 3 is a cross sectional view of a GaN-based Schottky diode provided with improved termination structure by forming the guard rings with epitaxial growth of the P-type GaN semiconductor in the trenches near the edges of the device.

FIG. 3 is a cross sectional view for showing a GaN-based diode 200 supported on an insulative substrate (not specifically shown). The diode 200 includes an N-type gallium nitride (GaN) layer 220 disposed on top of a portion of a highly doped N++ GaN semiconductor layer 210. Two cathode electrodes 230 are disposed on two opposite sides of the top surface of the N++ GaN semiconductor layer 210 adjacent to the N-type GaN layer 220. An anode electrode 240 is disposed on to of the N-type GaN layer 220. Multiple guard rings 250 are formed on the edge of the N-type GaN layer 220. The guard rings can have the same size or different. They are designed to reduce the electric field at the edge. The guard rings 250 are formed with epitaxial layer grown in the trenches opened on the edges of the N-type GaN layer 220, as shown in FIGS. 2 and 2A. The guard rings 250 formed with re-grown epitaxial layer in the trenches can be formed with controllable dopant profile, higher layer integrality, reduced resistance and endurable and reliable performance for the GaN diode device.

Figure 4:
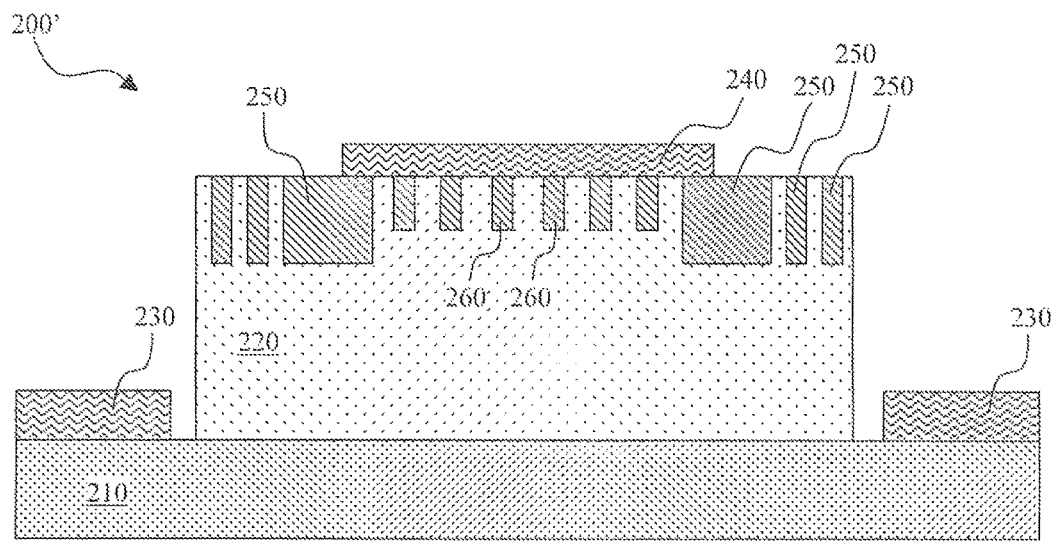
FIG. 4 is a cross sectional view of a GaN-based junction barrier Schottky diode provided with improved termination structure by forming the guard rings and JBS structures by applying an epitaxial growth process to form the P-type GaN semiconductor in the trenches.

FIG. 4 is a cross sectional view of another Schottky diode 200' as an alternate embodiment of this invention for as diode device with similar structure as that shown in FIG. 3. The only difference is the junction barrier Schottky (JBS) diode structure with multiple p-type regions 260 found underneath the Schottky anode electrode 240 constituting JBS P-type structures. The JBS structure with the p-type regions 260 underneath the anode electrode 240 further improves the breakdown characteristics of the Schottky diode device 200. With JBS structure, the p-type regions 260 deplete the adjacent portions of the N-type GaN layer 220 under reverse bias. Thus the leakage of Schottky barrier diode will be much reduced, improving the breakdown characteristics.

Figure 5:
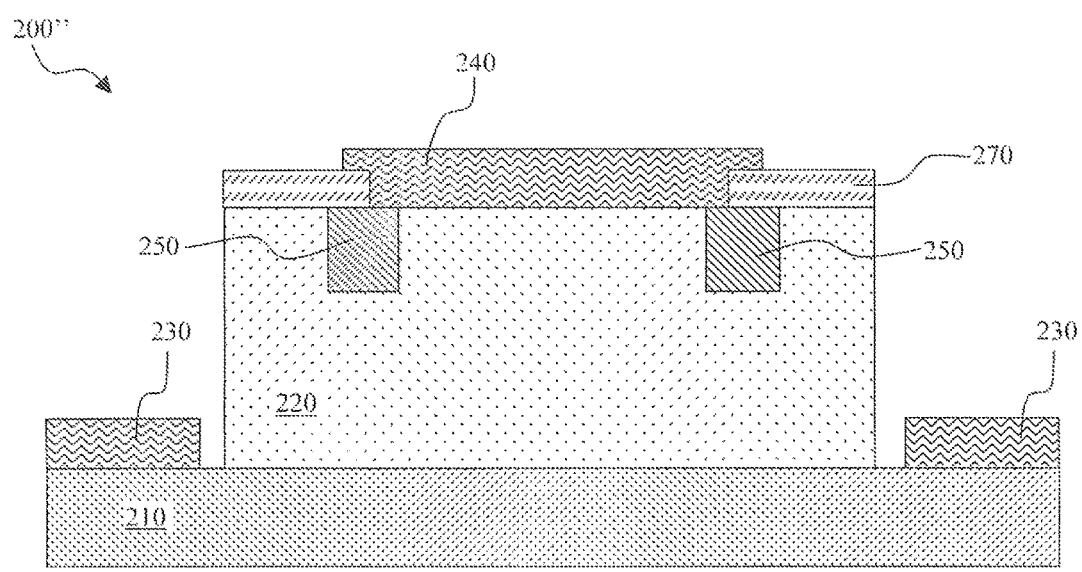
FIG. 5 is a cross sectional view of a GaN-based diode provided with improved termination structure by forming the guard rings with epitaxial growth of the P-type GaN semiconductor in the trenches near and also forming the field plates next to the anode electrode above the P-type guard rings close to the edges of the device.

FIG. 5 is a cross sectional view of another Schottky diode 200" as an alternate embodiment of this invention for a diode device with similar structure as that shown in FIG. 3. The only difference is the termination area now has different configuration. The termination area includes the p-type guard rings 250 formed with re-grown epitaxial layer in the trenches on the edges of the device. The termination area now further includes field plate 270 disposed on the top surface of the GaN layer 220 adjacent to the anode electrode 240 and partially covers the P-type guard rings 250. The field plate 270 helps to further reduce the electrical field crowding at the edges, which improves the breakdown characteristics.

Figure 6A:
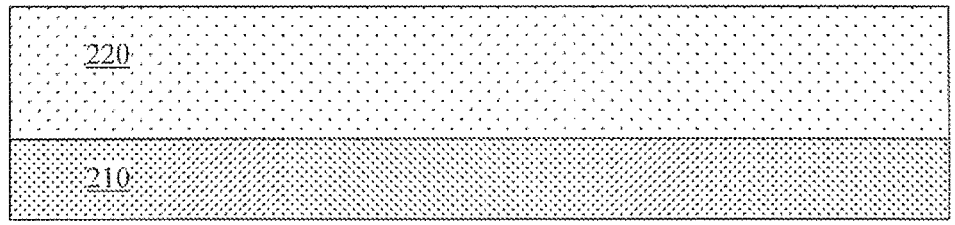
FIGS. 6A to 6F are a series of cross sectional views for illustrating the manufacturing processes to make a Schottky diode of FIG. 3.
Figure 6B:
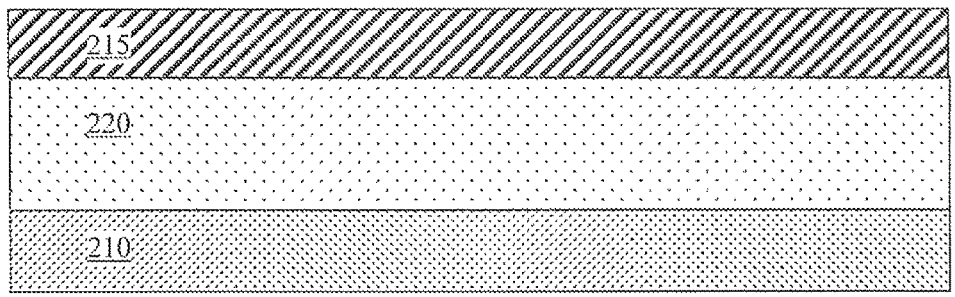
Figure 6C:
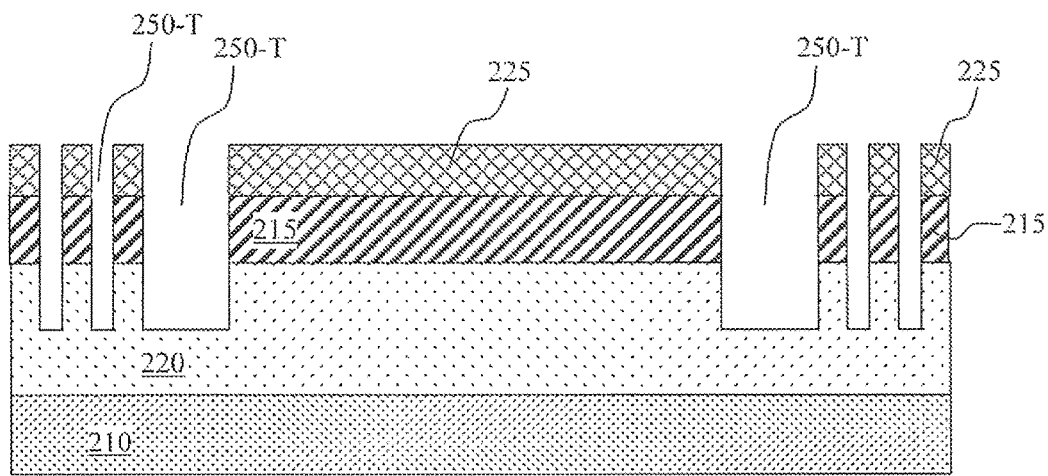
Figure 6D:
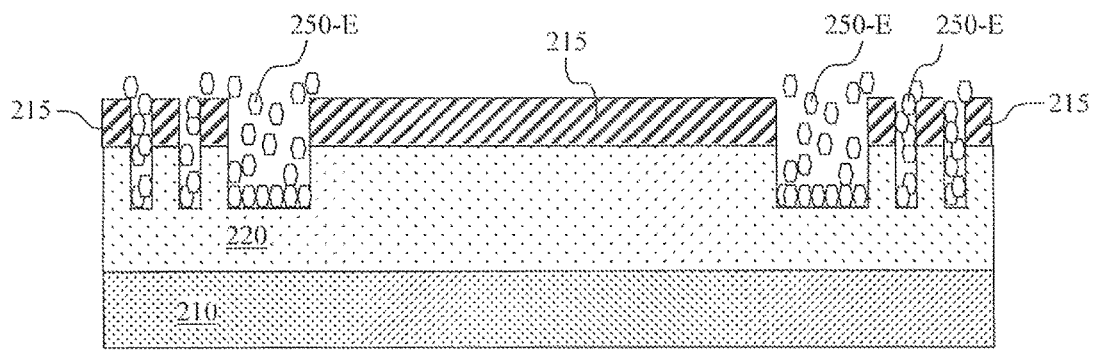
Figure 6E:
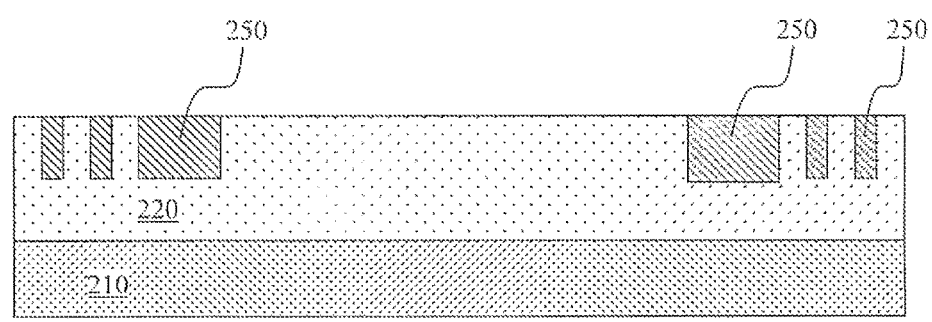
Figure 6F:
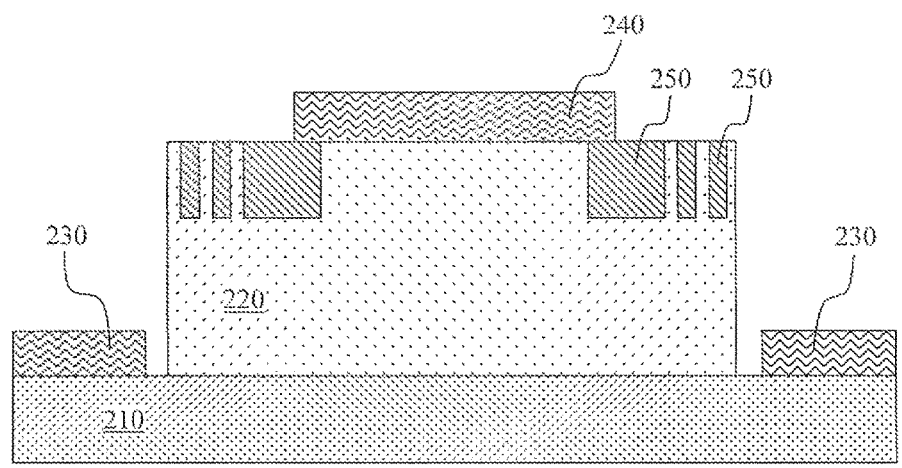

FIGS. 6A to 6F are a series of cross sectional views to show the processing steps to manufacture the GaN-based diode of this invention as shown in FIG. 4 above. FIG. 6A shows the process of growing gallium nitride semiconductor epitaxial layers 210 as a highly doped N++ GaN layer on top of an insulating substrate (not shown) and an N-type GaN layer 220 above the highly doped layer 210. In FIG. 6B, a re-growth mask layer 215 is applied. This mask layer 215 may be formed as a layer of SiOx, SiNx, Al2O3, AlN, or a spin-on glass layer, etc. In FIG. 6C, a photolithographic process is applied with a mask 225 to form the guard ring pattern. Then an etch process is carried out to etch the guard ring trenches 250-T according to the pattern into the GaN layer 220. If a JBS structure is desired, the JBS trenches for the JBS p-type structures under the Schottky metal may be formed at this time, either in the same etch process as the guard rings, or in a separate etch process. In FIG. 6D, the mask 225 for performing the photolithographic patterning is removed and a metal-organic chemical vapor deposition (MOCVD) is carried out to grow epitaxial P-type GaN 250-E into the trenches 250-T and form P-type epitaxial layer GaN layer 250. If a JBS structure is made, the JBS trenches may be filled with P-type epitaxial GaN at the same time. In FIG. 6E, the re-growth mask 215 is removed and a chemical mechanical planarization (CMP) process is carried out to planarize the top surface by polishing and removing the P-type epitaxial layer 250 overflow above the top surface of the guard ring trenches 250-T. In FIG. 6F, standard processes are carried out to form the anode electrode 240 and the cathode electrodes 230 to complete the manufacturing processes of the diode device 200. The anode electrode 240 can be a Schottky metal to form a Schottky diode in a main area of the device, while guard rings 250 are formed in the periphery of the device. The mesa shape of the N-type GaN layer 220 may be formed by etching away the N-type GaN layer 220 around the mesa down to the N++ GaN layer 210. This may be performed before forming the guard ring pattern, or after.

According to the drawings and above descriptions, this invention further discloses a method for manufacturing a gallium based semiconductor power device disposed in a semiconductor substrate. The method comprises a step of opening at least a trench at a peripheral area of the semiconductor power device and growing a doped gallium nitride based epitaxial layer in the trench to function as guard ring constituting a termination structure for the gallium based semiconductor power device. In another embodiment, the method further includes a step of forming a Schottky diode in a main area of the semiconductor power device and growing a P-type gallium nitride based epitaxial layer in the trench to form the guard ring as a P-type guard ring. In another embodiment, the method further includes a step of etching a plurality of junction barrier Schottky (JBS) trenches in a main area of the semiconductor power device and growing a doped gallium nitride based epitaxial layer in the JBS trenches to function as a P-type JBS structure. In another embodiment, the method further includes a step of planarizing the top of the doped gallium nitride based epitaxial layer after growing the gallium nitride based epitaxial layer in the trench. In another embodiment, the step of growing the doped gallium based epitaxial layer in the trench further comprises a step of growing a P-type gallium nitride based epitaxial layer in the trench. In another embodiment, the method further includes a step of epitaxial growing an N-type GaN layer on top of an epitaxial grown N++ GaN layer; electrically connecting an anode with the N type GaN layer and a cathode with the N++ GaN layer to function as a gallium based diode; wherein the step of opening the trench in the peripheral area is a step of opening the trench in the peripheral area of the N-type GaN layer and filling in the trench with a P-type gallium nitride based semiconductor layer to function as a guard ring for the gallium nitride based diode. In another embodiment, the method further includes a step of epitaxial growing an N-type GaN layer on top of an epitaxial grown N++ GaN layer; depositing a Schottky metal layer on top of the N type GaN layer and electrically connecting a cathode with the N++ GaN layer to function as a gallium nitride based Schottky diode; wherein the step of opening the trench in the peripheral area is a step of opening the trench in the peripheral area of the N-type GaN layer about the Schottky area and filling in the trench with a P-type gallium nitride based semiconductor layer to function as a guard ring for the gallium nitride based diode. In another embodiment, the method further includes a step of epitaxial growing an N-type GaN layer on top of an epitaxial grown N++ GaN layer; depositing a Schottky metal layer on top of the N type GaN layer and electrically connecting a cathode with the N++ GaN layer; wherein the step of opening the trench in the peripheral area is a step of opening the trench in the peripheral area of the N-type GaN layer and also opening multiple junction barrier Schottky (JBS) trenches in the middle portion of the N type GaN layer under where the Schottky metal layer will be located and epitaxially filling in the trench and JBS trenches with a P-type gallium nitride based semiconductor layer followed by forming a Schottky metal layer on top of the JBS trenches; wherein the JBS trenches filled with the P-type gallium nitride based semiconductor layer underneath the Schottky metal layer functioning as a portions of a junction barrier Schottky (JBS) diode and the trench in the peripheral area filled with the gallium nitride based semiconductor layer functioning as a guard ring for the JBS diode. In another embodiment, the method further includes a step of disposing a field plate on top of at least a portion of the guard ring for the termination structure. In another embodiment, the method further includes a step of epitaxial growing a first gallium based semiconductor layer on top of an epitaxial grown second gallium based semiconductor layer with a different dopant concentration from the first gallium based semiconductor layer; electrically connecting an anode with the first gallium based semiconductor layer and as cathode with the second gallium based semiconductor layer to function as a gallium based diode; wherein the step of opening the trench in the peripheral area is a step of opening the trench in the peripheral area of the first gallium based semiconductor layer and filling in the trench with a P-type gallium based semiconductor layer to function as a guard ring for the gallium based diode. In another embodiment, the method further includes a step of epitaxial growing a first gallium based semiconductor layer on top of an epitaxial grown second gallium based semiconductor layer with a different dopant concentration from the first gallium based semiconductor layer; depositing a Schottky metal layer on top of the first gallium based semiconductor layer and electrically connecting a cathode with the second gallium based semiconductor layer to function as a gallium based Schottky diode; wherein the step of opening the trench in the peripheral area is a step of opening the trench in the peripheral area of the first gallium based semiconductor layer and epitaxially filling in the trench with a P-type gallium based semiconductor layer to function as a guard ring for the gallium based diode. In another embodiment, the method further includes as step of epitaxial growing at first gallium based semiconductor layer on top of an epitaxial grown second gallium based semiconductor layer with a different dopant concentration from the first gallium based semiconductor layer; depositing a Schottky metal layer on top of the first gallium based semiconductor layer and electrically connecting a cathode with the second gallium based semiconductor layer to function as a gallium based Schottky diode; wherein the step of opening the trench in the peripheral area is a step of opening the trench in the peripheral area of the first gallium based semiconductor layer and also opening multiple junction barrier Schottky JBS trenches in the middle portion of the first gallium based semiconductor layer and epitaxially filling in the trench and JBS trenches with a P-type gallium based semiconductor layer followed by forming a Schottky metal layer on top of the JBS trenches; wherein the JBS trenches filled with the P-type gallium based semiconductor layer underneath the Schottky metal layer functioning as portions of as junction barrier Schottky (JBS) diode and the trench in the peripheral area filled with the gallium based semiconductor layer functioning as a guard ring for the JBS diode Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A gallium nitride based semiconductor power device comprising:
   a top gallium nitride layer comprises a plurality of guard rings disposed in a peripheral area of the top gallium nitride layer wherein the guard rings comprise a plurality of trenches having substantially a same depth opened in an upper portion of the top gallium nitride layer filled with a P-doped gallium-based epitaxial layer therein and wherein the guard rings surrounding a first electrode of the semiconductor power device comprises a metal layer covering over a middle portion of a top surface of the top gallium nitride layer; and
   a heavily doped bottom gallium nitride epitaxial layer extending beyond an outer edge of the top gallium nitride layer wherein an extended portion of the bottom gallium nitride epitaxial layer having an exposed top surface not covered by the top gallium nitride layer and wherein a second electrode of the semiconductor power device is disposed directly on the exposed top surface of the extended portion of the bottom gallium nitride layer.

2. The gallium nitride based semiconductor power device of claim 1 wherein:
   the semiconductor device constitutes a diode with the first electrode disposed on the top surface of the top gallium nitride layer constitutes an anode electrode of the diode and the second electrode disposed on the exposed top surface of the extended portion of the bottom gallium nitride layer constitutes a cathode electrode of the diode.

3. The gallium nitride based semiconductor power device of claim 2 wherein:
   the heavily doped bottom gallium nitride epitaxial layer comprises an N++ GaN layer supports the top gallium nitride layer formed as an N-type GaN layer; and
   the guard ring comprises the trenches filled with a P-type GaN layer disposed on the peripheral area of said N-type GaN layer.

4. The gallium nitride based semiconductor power device of claim 2 wherein:
   the heavily doped bottom gallium nitride epitaxial layer comprises an N++ GaN layer supports the top gallium nitride layer formed as an N-type GaN layer thereon with the anode electrode formed as a Schottky metal layer disposed on top of the N type GaN layer.

5. The gallium nitride based semiconductor power device of claim 1 further comprising:
   an N-type GaN layer disposed on top of an N++ GaN layer with a Schottky metal layer disposed on top of the N type GaN layer and a cathode in electrical connection with the N++ GaN layer; and a plurality of trenches underneath said Schottky metal layer opened in said GaN type layer filled with P-type gallium based epitaxial layer therein to function as a gallium based junction barrier Schottky (JBS) diode wherein said termination structure is disposed on peripheral area of said N type GaN layer.

6. The gallium nitride based semiconductor power device of claim 1 wherein:
said termination structure further comprises a field plate disposed on top of a portion of said guard ring.

7. The gallium nitride based semiconductor power device of claim 1 wherein:
the peripheral area of the top gallium nitride layer comprises at least two guard rings wherein each of the guard rings is disposed in a trench filled with the P-doped gallium-based epitaxial layer therein.

8. The gallium nitride based semiconductor power device of claim 1 wherein:
the peripheral area of the top gallium nitride layer comprises at least a first and a second guard rings wherein each of the first and second guard rings is disposed in a trench filled with the P-doped gallium-based epitaxial layer therein and wherein the first trench disposed closer to the middle portion of the top gallium nitride layer having a greater trench width than the second trench.

9. The gallium nitride based semiconductor power device of claim 1 further comprising:
a first gallium based semiconductor layer having a first dopant concentration disposed on top of a second gallium based semiconductor layer of a different dopant concentration with a Schottky metal layer disposed on top of the first gallium based semiconductor layer and a cathode in electrical connection with the second gallium based semiconductor layer; and
a plurality of trenches underneath said Schottky layer opened in said first gallium based semiconductor layer filled with P-type gallium based epitaxial layer therein to function as a gallium based junction barrier Schottky (JBS) diode wherein said termination structure disposed on peripheral area of said first gallium based semiconductor layer.

* * * * *